United States Patent [19]
Bourez et al.

[11] Patent Number: 5,685,959
[45] Date of Patent: Nov. 11, 1997

[54] CATHODE ASSEMBLY HAVING ROTATING MAGNETIC-FIELD SHUNT AND METHOD OF MAKING MAGNETIC SHUNT AND METHOD OF MAKING MAGNETIC RECORDING MEDIA

[75] Inventors: Allen J. Bourez; Brij Bihari Lal, both of San Jose; Michael A. Russak, Los Gatos, all of Calif.

[73] Assignee: HMT Technology Corporation, Fremont, Calif.

[21] Appl. No.: 736,980

[22] Filed: Oct. 25, 1996

[51] Int. Cl.$^6$ .................................................. C23C 14/34
[52] U.S. Cl. ............................ 204/192.2; 204/192.15; 204/298.17; 204/298.19; 204/298.2; 204/298.22
[58] Field of Search ............. 204/192.12, 192.15, 204/192.2, 298.11, 298.16, 298.17, 298.19, 298.2, 298.22

[56] References Cited

U.S. PATENT DOCUMENTS

| | | |
|---|---|---|
| 4,995,958 | 2/1991 | Anderson et al. .................. 204/298.2 |
| 5,130,005 | 7/1992 | Hurwitt et al. ..................... 204/192.12 |
| 5,174,880 | 12/1992 | Bourez et al. ...................... 204/298.17 |
| 5,188,717 | 2/1993 | Broadbent et al. ................. 204/192.12 |
| 5,252,194 | 10/1993 | Demaray et al. ................... 204/298.2 |
| 5,282,947 | 2/1994 | Brugge et al. ..................... 204/298.2 |
| 5,328,583 | 7/1994 | Kameyama et al. ............... 204/192.12 |
| 5,366,607 | 11/1994 | Lal et al. ........................... 204/298.19 |
| 5,374,343 | 12/1994 | Sasaki et al. ...................... 204/298.2 |
| 5,399,253 | 3/1995 | Grunenfelder ...................... 204/298.2 |
| 5,417,833 | 5/1995 | Harra et al. ........................ 204/298.2 |
| 5,512,150 | 4/1996 | Bourez et al. ...................... 204/192.2 |
| 5,514,257 | 5/1996 | Kobayashi et al. ................ 204/298.2 X |

*Primary Examiner*—Nam Nguyen
*Attorney, Agent, or Firm*—Judy M. Mohr; Peter J. Dehlinger

[57] ABSTRACT

A cathode assembly having a magnetic-field shunt for use in a magnetron sputtering apparatus is described. The magnetic-field shunt disposed between a sputtering target and a source of magnetic flux, and the shunt is moveable between first and second positions to effect preferential target erosion at first and second target regions, respectively. A method of using the assembly for preparation of a magnetic recording medium is also described.

18 Claims, 12 Drawing Sheets

CATHODE ASSEMBLY HAVING ROTATING MAGNETIC-FIELD SHUNT AND METHOD OF MAKING MAGNETIC SHUNT AND METHOD OF MAKING MAGNETIC RECORDING MEDIA

FIELD OF THE INVENTION

The present invention relates to a cathode assembly for use in a magnetron sputtering apparatus having a rotating magnetic-field shunt.

BACKGROUND OF THE INVENTION

Cathode sputtering is widely used for depositing thin films of material onto substrates. The process involves vaporizing a material by ion bombardment of a target which forms part of a cathode assembly in an evacuated chamber containing an inert gas such as argon. A high voltage electric field is applied between the cathode assembly and an anode in the chamber, and the gas is ionized by collision with electrons ejected from the surface of the cathode. The positive gas ions are attracted to the cathode surface, and atoms of material dislodge when the ions strike the target, traverse the enclosure and deposit as a thin film onto a substrate positioned on a support maintained at or near anode potential.

Although the sputtering process can be carried out solely in an electric field, substantially increased deposition rates are possible with magnetron sputtering in which an arched magnetic field, formed in a closed loop over the surface of the sputtering target, is superimposed on the electric field. The arched closed-loop magnetic field traps electrons in an annular region adjacent to the surface of the target, thereby multiplying the collisions between electrons and gas atoms to produce a corresponding increase in the number of ions in that region.

In such magnetron sputter coating process, the sputtering of materials from the sputtering target occurs most rapidly in regions of the target where the plasma trapped by the magnetic field is most dense. This localized region of trapped plasma erodes a narrow groove in the target, resulting in poor target utilization and generating a non-uniform distribution of sputtered atoms. Typically, the deposition of material from the target onto the substrate is correspondingly non-uniform, where, often a film having a greater thickness at the disc outer diameter is sputtered as a function of target life.

A variety of approaches for improving target utilization by changing the erosion pattern have been proposed, typically involving moving the magnetic field in relation to the target, either by movement of the target or by movement of the magnetic field generating source, e.g., permanent magnets.

Sputtering from a target while moving the target with respect to the magnetic field sometimes achieves a broadening of the erosion pattern for more uniform consumption of the target, however such a process can result in a non-uniform coating deposited on the substrate.

Attempts to broaden target erosion by rotating the source of magnetic flux have been only partially successful, leaving portions of the target, in particular the center portion of circular targets, unsputtered. Unsputtered target regions are problematic in that sputtered particles deposit on unsputtered areas to form a thin film, which can shed or crack off, causing particulate contamination.

Other attempts to broaden the erosion field over a larger target surface area have been made by using extended magnetic fields. The magnets required for such an approach are large and complicated and the erosion pattern is often difficult to predict.

Such approaches to broadening the erosion field are typically in connection with sputter deposition of nonmagnetic films, such as thin semiconductor films of aluminum deposited on silicon wafers. In general, target erosion patterns from sputter deposition of a nonmagnetic target are more easily varied in response to movement of the magnetic field than are erosion patterns of a magnetic target, where the magnetic fluxes generated from the magnetic source penetrate through the magnetic target. Penetration of flux through a magnetic target decreases flux leakage around the target disadvantageously, making changes in target erosion profiles more difficult.

SUMMARY OF THE INVENTION

Accordingly, it is an object of the invention to provide an apparatus and a method for sputtering from a target which achieves uniform deposition of sputtered material onto a substrate and improved target utilization.

It is also an object of the invention to provide such an apparatus and a method for use with a target composed of a magnetic material.

In one aspect, the invention includes a cathode assembly for use in a magnetron sputtering apparatus. The assembly includes a sputtering target having a planar sputtering surface and north and south magnetic poles disposed with respect to the target to produce a magnetic field over the target surface for magnetron sputtering. A magnetic-field shunt is disposed between the target and the magnetic poles. The assembly also includes means for moving the shunt relative to the poles between first and second positions at which the magnetic field on the target surface causes preferential target erosion at first and second target regions, respectively. Repeated movement of the shunt between such first and second positions during target sputtering is effective to produce preferential erosion over the first and second regions, respectively.

In one embodiment, the shunt in the cathode assembly includes a center region disposed over either the north or south pole. A first shunt portion extending radially out from the center region functions as a radial extension of that pole, and a second shunt portion attached to, but spaced from, the center region functions as an extension of the other pole. The means for moving the shunt further includes means for rotating the shunt about an axis substantially normal to the plane of the target surface.

In one embodiment, the target in the assembly is composed of a magnetic material, such as a cobalt-based magnetic alloy.

The north and south magnetic poles are produced by an electromagnetic coil or, in another embodiment, by a permanent magnet.

In another aspect, the invention includes a cathode assembly for use in a magnetron sputtering apparatus including a sputtering target having a planar sputtering surface and north and south magnetic poles disposed with respect to the target to produce a magnetic field over the target surface for magnetron sputtering. A magnetic-field shunt is disposed between the target and the magnetic poles. The assembly also includes means for moving the shunt relative to the poles between first and second positions at which the shunt functions as an extension of the north and south poles. Repeated movement of the shunt between such first and second positions shifts the magnetic-field between first and second target regions, respectively, to produce preferential target erosion in the first and second target regions.

In another aspect, the invention includes a method of forming on a substrate by sputter deposition a thin-film layer in a magnetic recording medium. The method includes placing a substrate in a sputtering chamber including a cathode assembly composed of (i) a sputtering target having a planar sputtering surface, (ii) north and south magnetic poles disposed with respect to the target to produce a magnetic field over the target surface for magnetron sputtering, (iii) a magnetic-field shunt disposed between the target and the magnetic poles, and (iv) means for moving the shunt relative to the poles between first and second positions at which the magnetic field on the target surface causes preferential target erosion at first and second target regions, respectively, whereby repeated movement of the shunt between such first and second positions during target sputtering is effective to produce preferential erosion over the first and second regions, respectively. A sputtering plasma is ignited by energizing the target and the shunt is moved repeatedly between the first and second positions to sputter a layer onto the substrate.

In still another aspect, the invention includes a magnetic recording structure for storing magnetic information. The structure includes a magnetic recording layer formed by sputtering from a cathode assembly as described above.

In one embodiment of this aspect, the structure is a magnetic recording medium formed on a rigid substrate and the target is composed of a magnetic material, such as a cobalt-based magnetic alloy. Such a magnetic layer, in one embodiment, is deposited on a nonmagnetic underlayer.

These and other objects and features of the invention will be more fully appreciated when the following detailed description of the invention is read in conjunction with the accompanying drawings.

DETAILED DESCRIPTION OF THE INVENTION

I. Cathode Assembly

Figure 1:
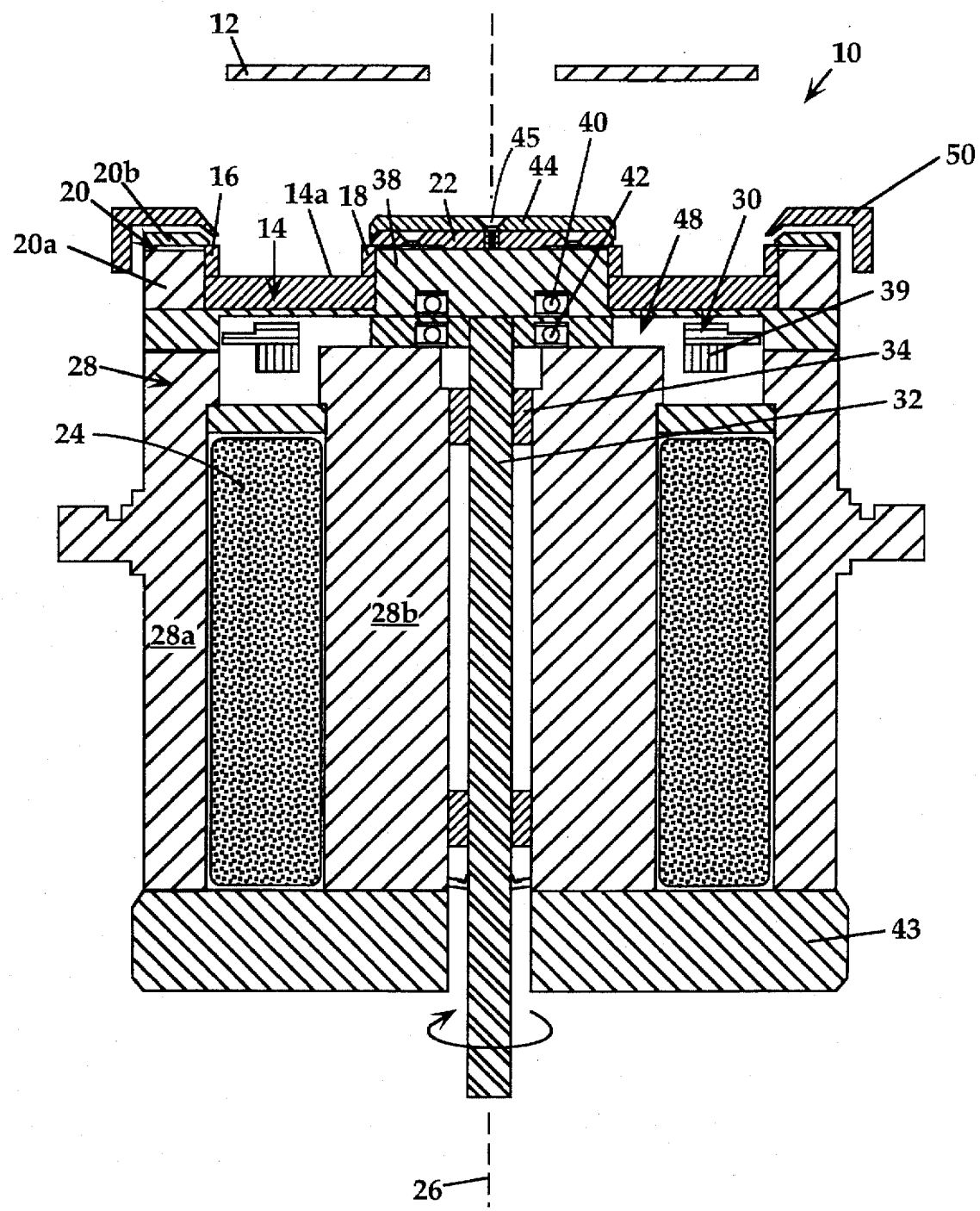
FIG. 1 is a cross sectional view of a sputter cathode assembly in accordance with the invention.

FIG. 1 shows a cross sectional view of an annular cathode assembly 10, in accordance with the present invention, positioned in a sputtering chamber (not shown) for use in forming a magnetic recording structure, and in particular, a thin-film magnetic recording medium. Preferably, the assembly is positioned in an in-line, pass-by sputtering apparatus. It will be appreciated that a similar cathode assembly confronts assembly 10, that is with respect to the assembly as shown in FIG. 1, positioned "above" assembly 10, for sputtering a film onto upper and lower sides of a substrate 12 positioned between the confronting cathode assemblies.

Assembly 10 includes a sputtering target 14 having an exposed, planar sputtering surface 14a. In a preferred embodiment and as shown in the figure, the target is annular, however other geometries, such as square or rectangular, are contemplated. An annular outer diameter target pole 16 and an inner diameter target pole 18 are positioned against the outer and inner diameter surfaces, respectively, of target 14 and extend beyond sputtering surface 14a. Outer diameter target pole 16 is held in place by a clamp 20 including a bottom clamp portion 20a and a top clamp portion 20b. inner diameter target pole 18 is secured to target 14 by an inner clamp 22. Target 14, outer pole 16 and inner ring 18 are made of a conventional sputtering target material, such as a CoCrTa magnetic alloy, and together form a three-piece target for use in the cathode assembly of the present invention.

Assembly 10 also includes magnetic poles for producing a magnetic field over the surface of the target for magnetron sputtering. As will be discussed with respect to FIGS. 3–4, north and south magnetic poles are disposed with respect to the target to produce a magnetic field over the target surface. As shown in FIG. 1, the magnetic poles are generated by an electromagnetic coil assembly 24, oriented with its magnetic poles substantially radial to the central axis of the assembly, designated by dashed line 26. When the coil assembly is energized, a magnetic field is generated that serves to confine the sputtering plasma to a defined region about target surface 14a for deposition on substrate 12. It will be appreciated that permanent magnets are also suitable for generating the magnetic field.

Electromagnetic coil 24 is housed in a pole weldment assembly 28 including an outer cylindrical pole piece 28a and an inner cylindrical pole piece 28b, having a smaller diameter than the outer pole piece. The inner and outer pole pieces are formed of a material suitable for conducting magnetic flux, as will be discussed.

According to an important feature of the invention, the cathode assembly includes a magnetic-field shunt assembly 30 disposed between target 14 and the north and south magnetic poles. The shunt is mounted on a shaft 32 rotatably driven by a motor (not shown) about the shaft's central axis 26. The shaft is centered for rotation by bushings, such as bushing 34. The magnetic-field shunt assembly is carried on the upper end of the shaft in the figure for rotation therewith.

With reference to FIGS. 1–2, the shunt assembly includes a center region 36 which is mounted on the shaft and disposed between a stationary pole cap 38 and inner pole piece 28b, which is also stationary. The assembly also includes a mounting plate 39 for securing the shunt portions (described below) to the shunt assembly. A thrust bearing 40 mounted in the pole cap acts as a rotatable spacing, separating the pole cap from the shunt's center region to allow for rotation of the shunt when the electromagnetic coil is energized the assembly is magnetized. A second thrust bearing 42 mounted in the center region of the shunt acts to rotatably space the shunt from the inner pole piece during shaft rotation, as will be described.

Completing the description of FIG. 1, a rear pole caps the pole weldment assembly and is held in place by a suitable fastening means, such as screws. At the opposite end of the assembly, a center cap 44 formed of a nonmagnetic material serves as shield for the magnetic-field shunt and is held in place with screw 45. Pole cap 38 abuts target 14 and functions as a backing plate and plays a role in controlling and adjusting the magnetic field.

The cathode assembly is cooled by water which travels in channel a channel (not shown) provided in the pole weldment and around a target-cooling cavity Finally, a conventional ground shield 50 extends circumferentially around the target assembly adjacent the outer ring clamps, as shown.

Turning again to FIG. 2, magnetic-field shunt assembly 30 includes first and second shunt portions 64, 66, attached to center region 36 through a mounting plate, not shown in the figure. The shunt portions are composed of a magnetic material, such as 410 or 416 stainless steel, iron, or mild steel. First shunt portion 64 extends radially out from the center region and functions as an extension of the pole over which the center region is positioned. Second shunt portion 66 is attached to, but spaced from, the center region and functions as an extension of the opposite pole. In the embodiment shown in FIG. 2, first and second shunt portions 64, 66 are each composed of two sectors, such as sectors 68, 70 of first shunt portion 64 and sectors 72, 74 of second shunt portion 66. It will be appreciated that the number of sectors forming the first and second shunt portions can be varied as desired.

Figure 2A:
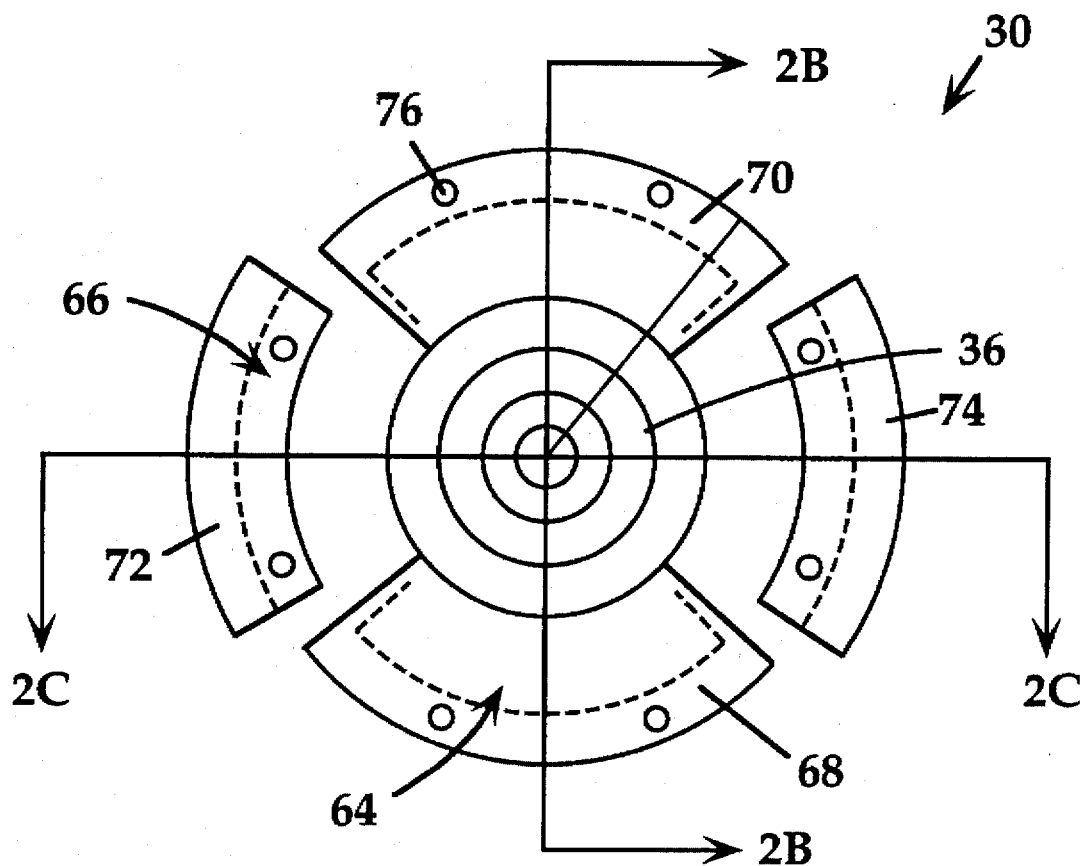
FIG. 2A is a plan view of a magnetic-field shunt for use in the assembly shown in FIG. 1.

Each sector of the first and second shunt portions shown in FIG. 2A is secured to the mounting plate by a nonmagnetic bolt, such as bolt 76 in sector 70. The mounting plate is composed of a nonmagnetic material, such as a 300-series stainless steel, preferably 303 stainless steel.

Figure 2B:
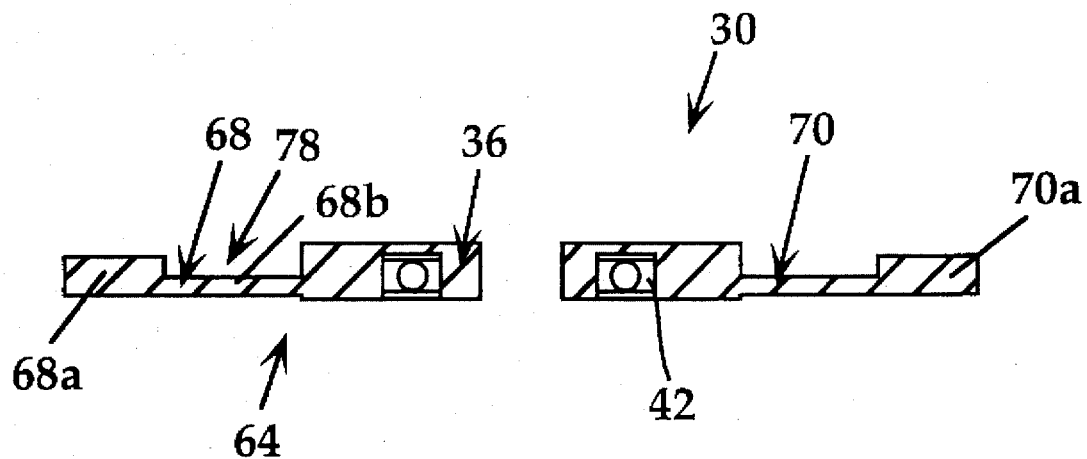
FIGS. 2B-2C are cross-sectional views of the magnetic-field shunt taken along lines B—B (FIG. 2B) and lines C—C (FIG. 2C) of FIG. 2A.
Figure 2C:
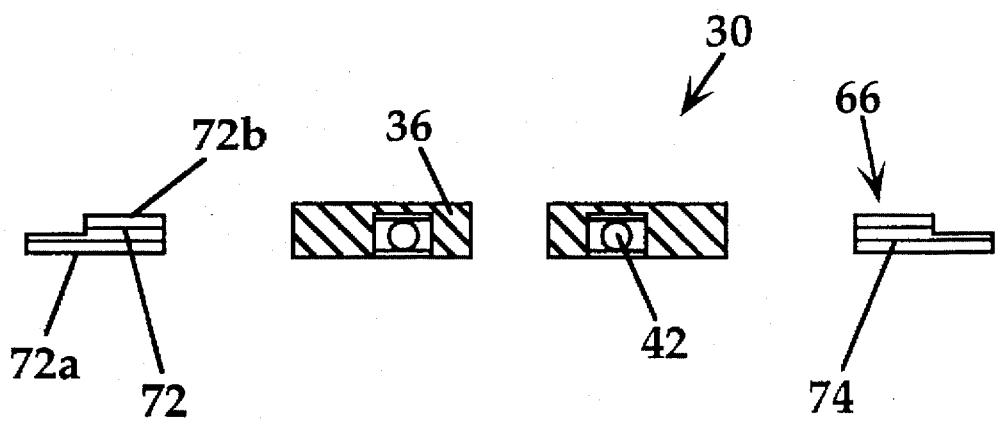

Cross sectional views of the magnetic-field shunt taken along lines B—B and C—C of FIG. 2A are shown in FIGS. 2B and 2C, respectively. As seen in FIG. 2B, shunt portion 64, having sectors 68, 70, extends from center region 62. Sectors 68, 70 are shaped to have a thicker portion, such as portion 68a, which is spaced from the center region by a thinner portion, such as portion 68b, thereby defining a gap 78. The gap, defined by the shape and size of the shunt sectors, is used to control the amount and the path of magnetic flux conducted through the assembly, as will be described.

The cross sectional view in FIG. 2C shows second shunt portion 66, which is spaced from the center region of the shunt, and sectors 72, 74. Sectors 72, 74 are shaped to have a thinner portion, such as portion 72a at the outer region of the shunt and a thicker portion, such as portion 72b, for controlling the magnetic flux path, as will be described.

Figure 3A:
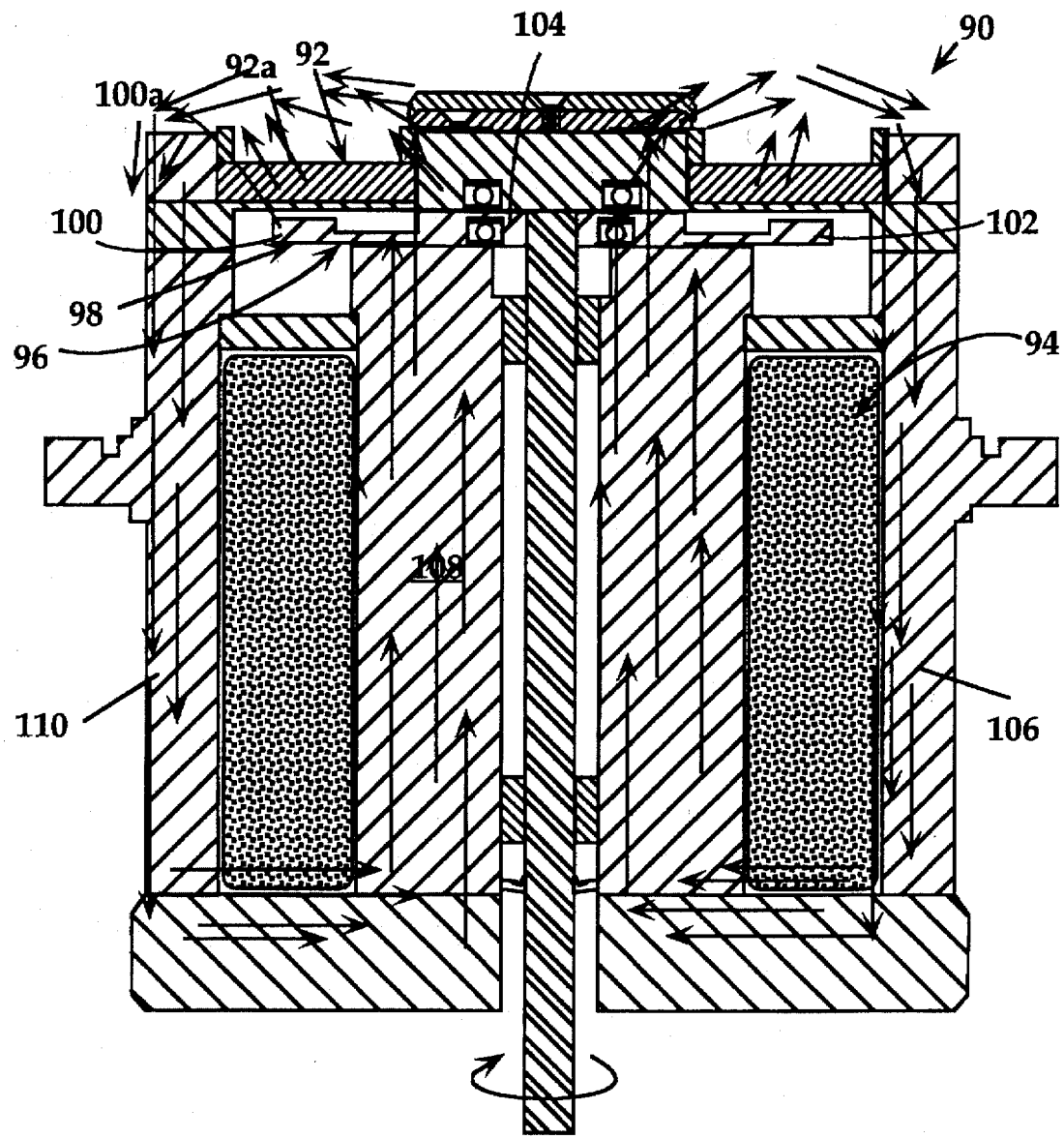
FIGS. 3A-3B are cross-sectional views of the target assembly (FIG. 3A) and the upper portion of the assembly enlarged (FIG. 3B) showing the distribution of magnetic field lines with the shunt in a first position.
Figure 3B:
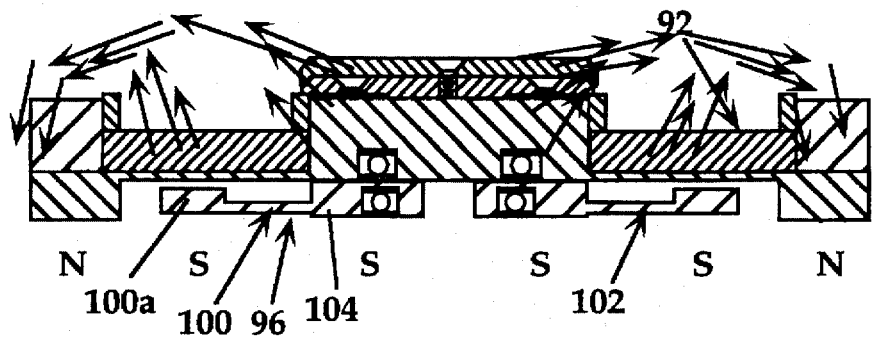

FIGS. 3A and 3B are cross sectional views of a cathode assembly 90, like that shown in FIG. 1, showing the distribution of magnetic-field lines during operation of the assembly with the shunt in a first position. Cathode assembly 90 includes an annular three-piece sputtering target 92 and a source of magnetic flux, such as an electromagnetic coil assembly 94. Disposed between the target and the magnetic flux source is a shunt having a first shunt portion 98 composed of sectors 100, 102 attached to center region 104.

In operation of the cathode assembly, the electromagnetic coil is energized to generate a magnetic field having a north pole (N) and a south pole (S). The south to north path of magnetic flux in the assembly is indicated in FIGS. 3A–3B by the arrows, such as arrow 106 in FIG. 3A.

As seen best in FIG. 3B, center region 104 of the magnetic-field shunt has a south pole orientation, defined by proximity to the south pole of the magnetic field source. The magnetic-field shunt as shown is in a first position, such that magnetic flux is conducted along a first path defined by travel along the inner pole weldment assembly 108 (FIG. 3A), across the shunt by conduction along the center region 104 and the thicker portion 100a of shunt sector 100, across target 92 and along an outer pole weldment piece 110.

As seen clearly in FIG. 3B, the magnetic-field shunt in its first position urges the magnetic field preferentially toward an outer diameter region 92a of sputtering target 92. That is, the magnetic field switches from a south to north orientation at outer diameter region 92a, defining a first target region of preferential erosion, that is, a region of greater erosion.

Figure 4A:
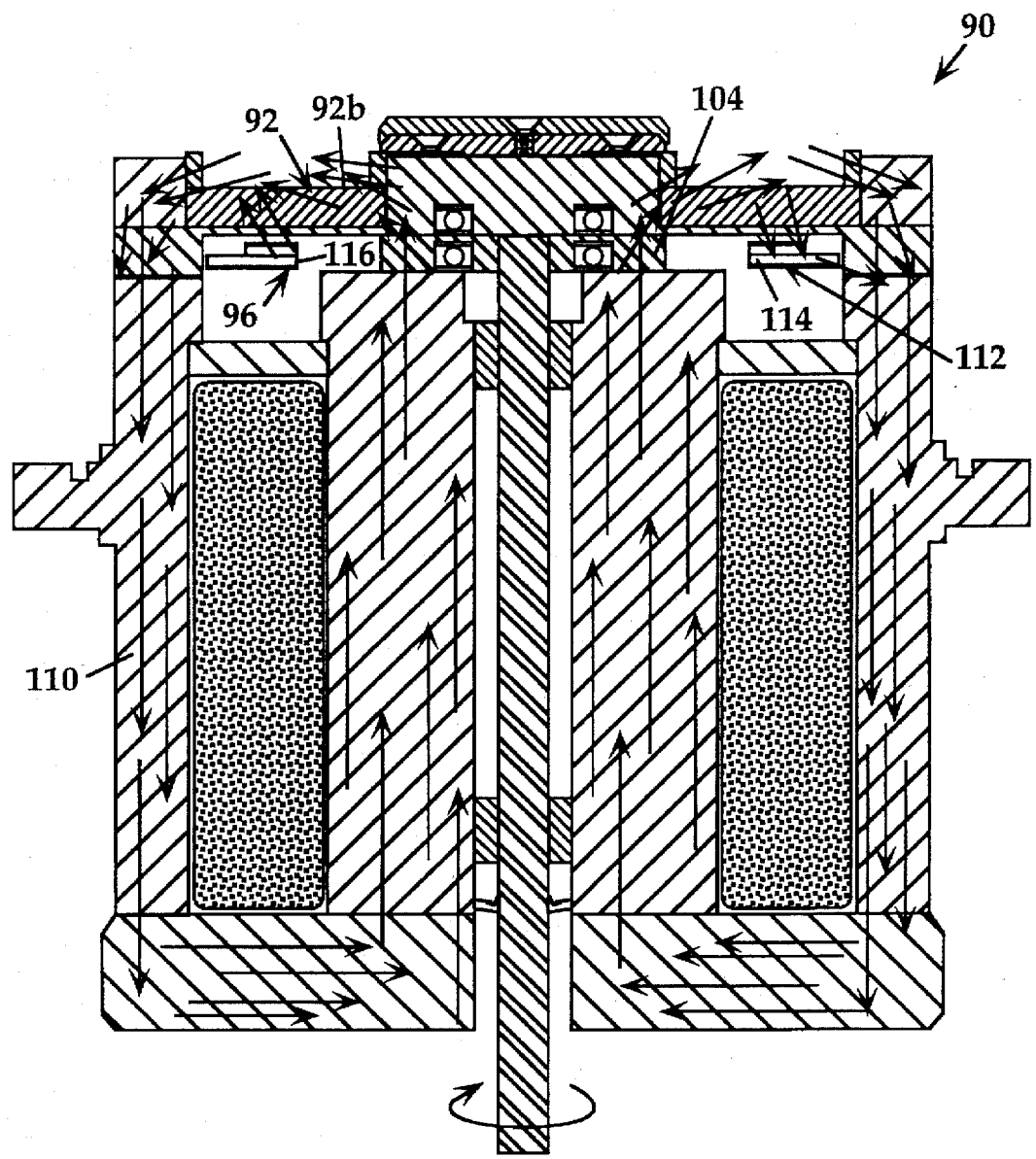
FIGS. 4A-4B are cross sectional views of the target assembly (FIG. 4A) and the upper portion of the assembly enlarged (FIG. 4B) showing the distribution of magnetic field lines with the shunt in a second position.
Figure 4B:
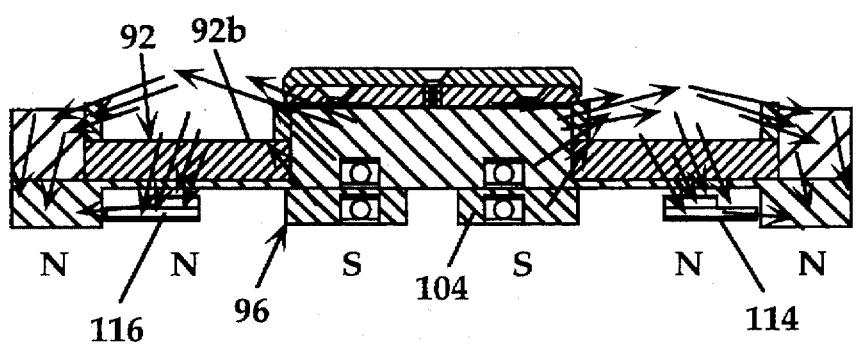

FIGS. 4A–4B show cathode assembly 90 where the magnetic-field shunt 96 is in a second position, corresponding to that shown in FIG. 2C above, where shunt portion 112, having sectors 114, 116, is in view. Magnetic flux is conducted along a second path defined by travel along inner pole weldment piece 108, through the center region 104, across an inner portion 92b of sputtering target 92, through shunt sectors 114, 116, and along the outer pole weldment piece 110.

As seen most clearly in FIG. 4B, when the shunt is in the second position, magnetic flux is urged toward inner diameter region 92b of the sputtering target, defining a preferential region of target erosion, that is, a region where target erosion is greater.

It can be appreciated that operation of the magnetic-field shunt by moving the shunt between such first and second positions is effective to shift the magnetic field between first and second positions, defining first and second target regions of preferential target erosion.

The shunt in a preferred embodiment is rotated between first and second positions by rotation of the shaft which is driven by a suitable drive means. However, it will be appreciated that the shunt can also reciprocate between first and second positions, by a two positional movement of the shaft.

As discussed above, the magnetic-field shunt of the present invention is effective to promote erosion over a broader target region, improving target utilization. This feature can be appreciated from the sputtering diagrams in FIGS. 5A–5B which show cross-sectional profiles of sputtering targets near the end of target usage after sputtering in a conventional cathode assembly, e.g., an assembly with no magnetic-field shunt (FIG. 5A), and after sputtering using the cathode assembly of the present invention (FIG. 5B).

Figure 5A:
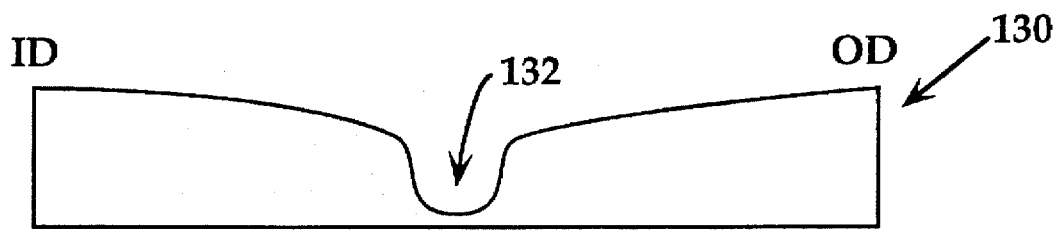
FIGS. 5A-5B illustrate cross-sectional erosion profiles of a target after 30 kW hours of sputtering in a conventional cathode assembly (FIG. 5A) and after 70 kW hours of sputtering using the cathode assembly of the present invention with a rotating magnetic-field shunt (FIG. 5B)
Figure 5B:
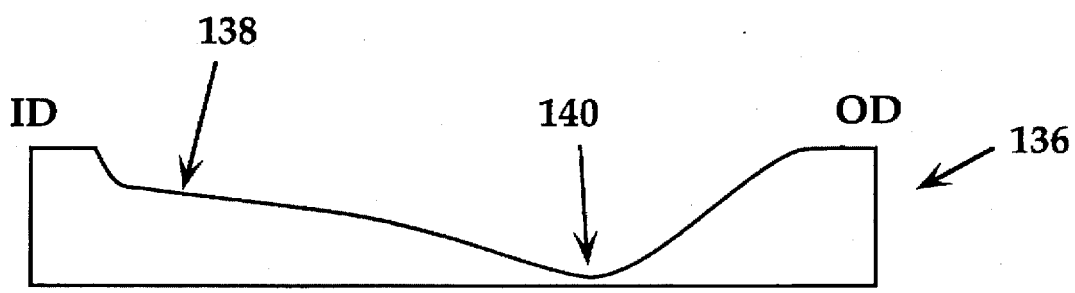

FIG. 5A shows that after 30 kilowatt hours of sputtering from a standard cathode assembly with a stationary, fixed magnetic field, erosion of target 130 is concentrated in a relatively narrow center region 132. In contrast, after about 70 kilowatt hours of target use, target 136, shown in FIG. 5B, sputtered in the cathode assembly of the present invention, shows preferential target erosion in a first target region 138 and in a second target region 140. Target erosion in region 138 is achieved, as discussed above with respect to FIG. 3A, with the magnetic-field shunt in a first position, effective to urge the magnetic flux toward an outer diameter region of the target. Target erosion in region 140 is achieved, as discussed above with respect to FIG. 4A, with the magnetic-field shunt in a second position, effective to urge the magnetic flux toward an inner diameter region of the target.

Figure 6A:
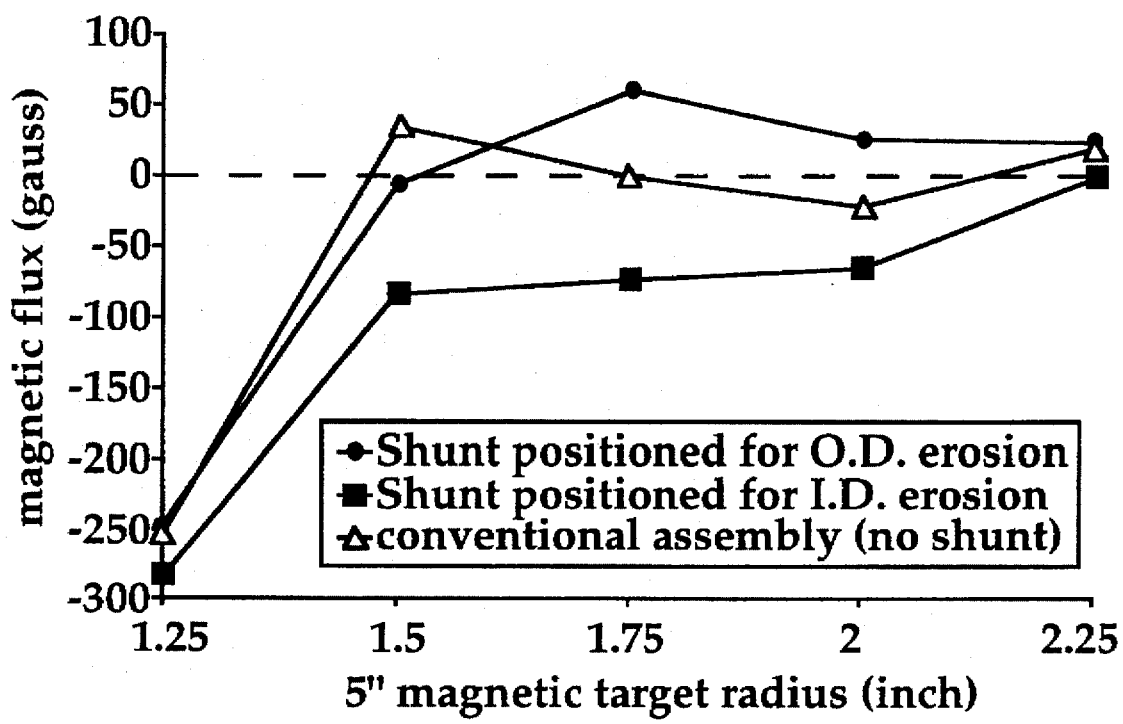
FIGS. 6A-6B are plots of out-of-plane magnetic flux (FIG. 6A) and in-plane magnetic flux (FIG. 6B) across a 5 inch diameter magnetic target.
Figure 6B:
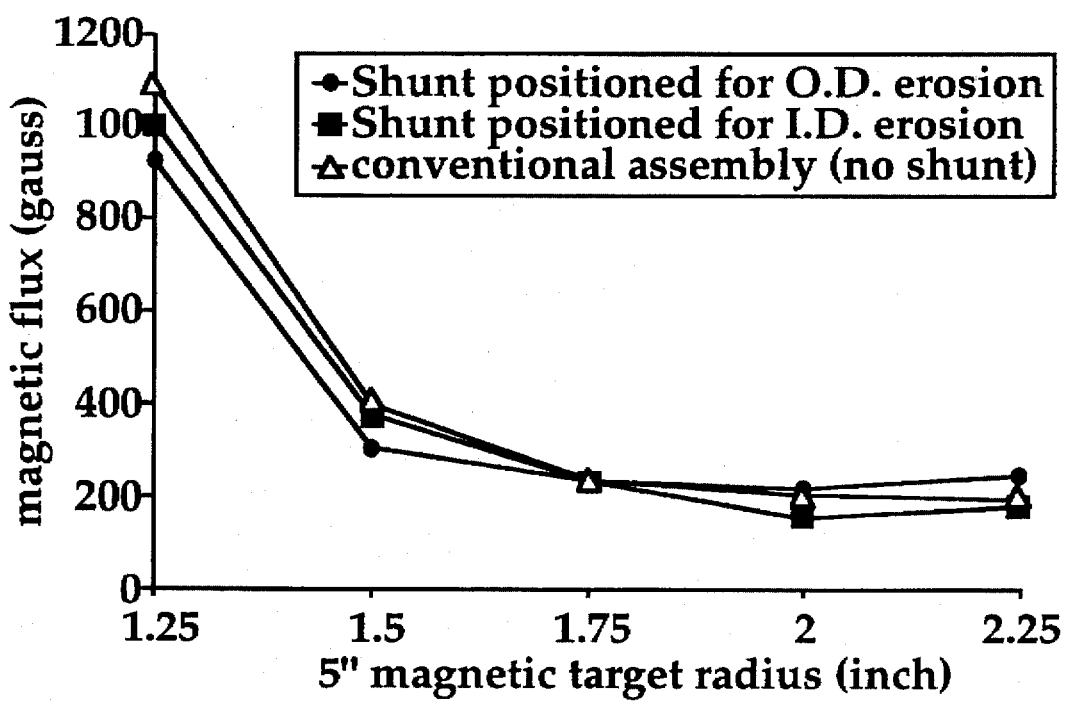

FIGS. 6A–6B compare the out-of-plane magnetic flux (FIG. 6A) and the in-plane magnetic flux (FIG. 6B) across the diameter of a magnetic target positioned in the cathode assembly of the present invention to that of a target positioned in a conventional cathode assembly (Δ). In-plane and out-of-plane magnetic flux was measured using a Gaussmeter, with the probe parallel to the target surface (in-plane) and with the probe perpendicular to the target surface (out-of-plane).

For the conventional assembly, the magnetic flux switches from negative to positive, that is, the magnetic flux crosses zero, at a target radius of 1.75 inches (Δ). This switching point is where target erosion is most concentrated, and, as discussed above, for conventional target assemblies, erosion is confined to a narrow ring in a center region of the target.

For the assembly of the present invention, the out-of-plane magnetic flux and the in-plane magnetic flux were measured with the magnetic-field shunt in its first and second positions, as shown above, for example in FIGS. 3B and 4B. As seen, when the shunt is positioned such that the magnetic flux is biased toward erosion of the outer diameter region of the target, the magnetic flux crosses zero at a target position of 1.5 inches (●). When the shunt is positioned to bias the magnetic flux toward the inner diameter of the target, the magnetic field switches from negative to positive at a target radius of about 2 inches (■). This data indicates that the magnetic-field shunt promotes erosion of the target over a broader area, encompassing first and second target regions, as described above.

FIG. 6B shows the in-plane magnetic flux for the target assembly of the present invention, with the magnetic-field shunt in first and second positions (●,■) conventional target assembly (Δ). This show that there is very little effect on the in-plane flux with this design.

II. Operating Characteristics

In operation, the sputtering chamber which houses the above described cathode assembly is evacuated, and an inert sputtering gas, such as argon, is introduced into the chamber to a final pressure of between about 2–20 mTorr typically. A voltage applied across the anode and cathode of the assembly produces electron collisions with the chamber gas which create positive ions formed between the two electrodes. These ions, in the form of a sustained plasma, impact the target surface, ejecting atoms which are then deposited on the confronting surface of the substrate.

In accordance with the present invention, the cathode assembly includes a magnetic-field shunt positioned between the sputtering target and a source of magnetic flux in the assembly. The shunt is moveable between first and second positions at which the magnetic field on the target surface causes preferential target erosion at first and second target regions. As indicated above, the shunt is effective to broaden the erosion profile of the sputtering target, improving both target utilization and uniformity of deposition on the substrate.

In experiments performed in support of the present invention, sputtering was carried out using an Intevac, representative of a double-sided, single-disc, high-throughput machine having two interlocking systems, for loading and unloading. The cathode in the apparatus was modified to include the magnetic-field shunt in accordance with the present invention. The sputtering chamber was evacuated to pressure of about $10^{-7}$ Torr, and argon gas was introduced into the chamber at 50 SCCM to a final sputtering pressure of between about 3–20 mTorr. The sputtering target was a cobalt-based alloy, that is, a target containing more than 50% cobalt, and in preferred embodiments was composed of CoCrTa (88/8/4). DC power was supplied to the cathode at 2 KW and the magnetic-field shunt was rotated at between 1–180 revolutions per minute.

Figure 7:
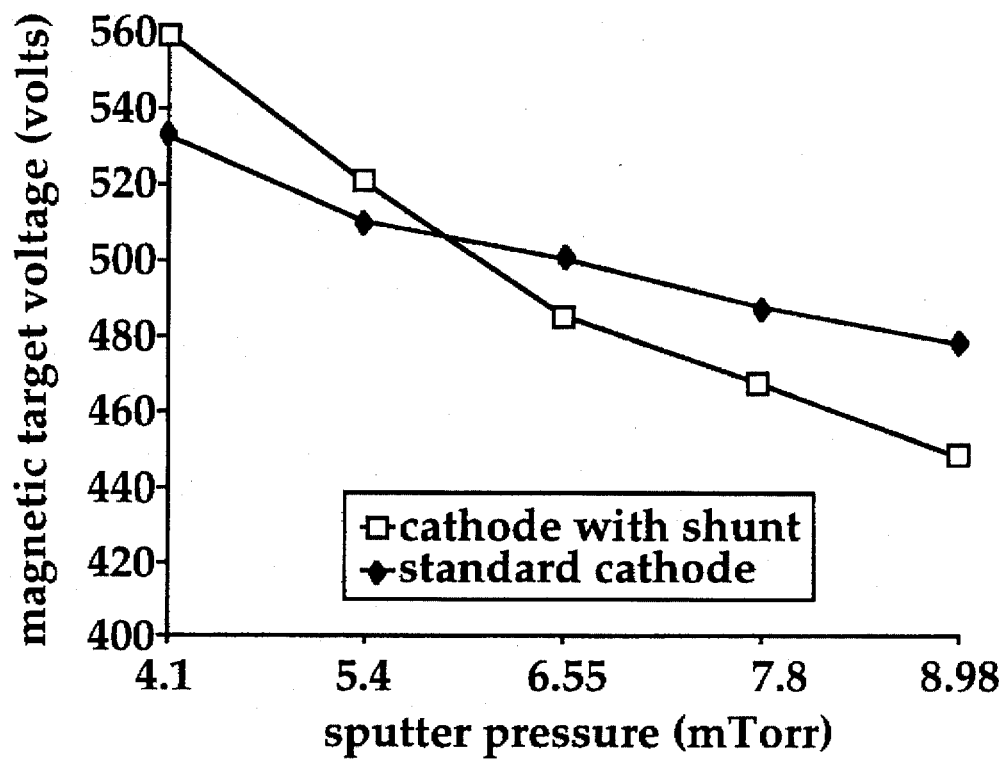
FIG. 7 is a plot of magnetic target voltage as a function of pressure in the sputtering chamber, in mTorr, for the cathode assembly of the present invention ($\Box$) and for a standard cathode assembly ($\blacklozenge$)

One measure of sputtering efficiency is the plasma voltage required to ignite the sputtering plasma, at a given chamber gas pressure. FIG. 7 is a plot of magnetic target voltage as a function of pressure in the sputtering chamber, in mTorr, for the cathode assembly of the present invention (□) and a standard cathode assembly (♦). The figure shows that a sputtering plasma is ignited at a higher voltage and a lower sputtering pressure with the cathode assembly of the present invention compared to a standard cathode assembly.

Figure 8:
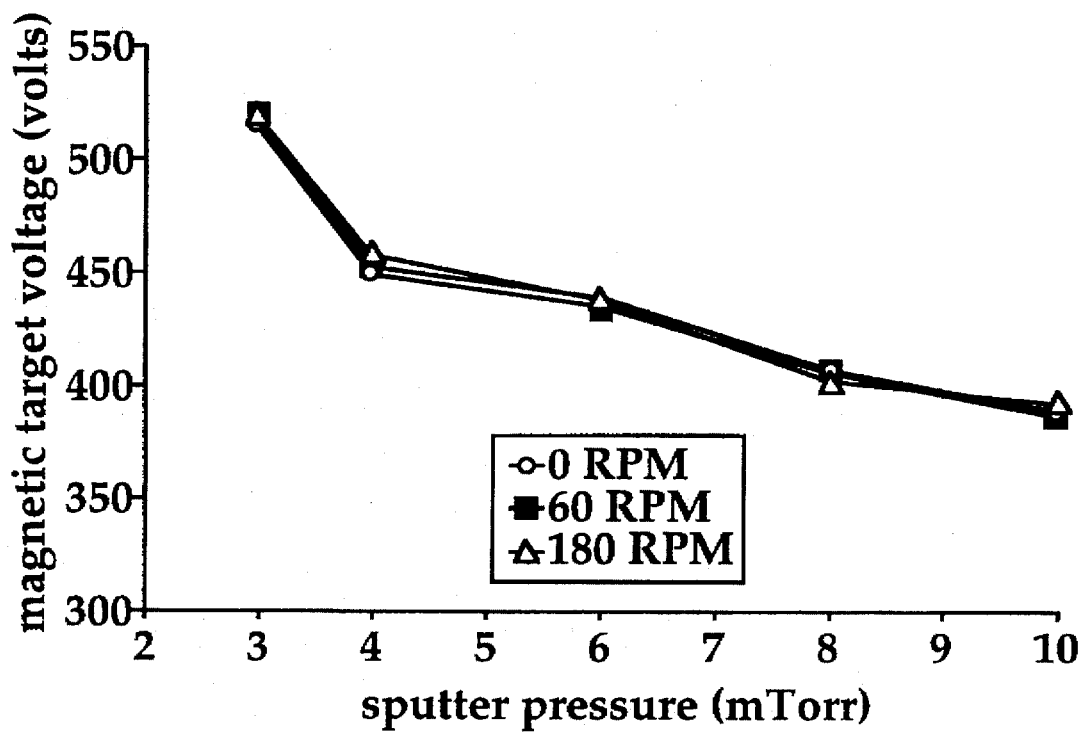
FIG. 8 is a plot of magnetic target voltage as a function of pressure in the sputtering chamber, in mTorr, for the cathode assembly of the present invention where the magnetic-field shunt is stationary (o) or is rotating at 60 RPM ($\blacksquare$) or 180 RPM ($\Delta$)

FIG. 8 is a similar plot, showing magnetic target voltage as a function of pressure for the cathode assembly of the present invention where the magnetic-field shunt is stationary (o) and is rotating as 60 RPM (■), 180 RPM (Δ). As seen, the rotation of the shunt has no measurable effect of ignition of a sputtering plasma, as the plasma ignites at nearly the same voltage for each pressure tested regardless of whether or not the shunt is rotating or of the speed of rotation.

Figure 9:
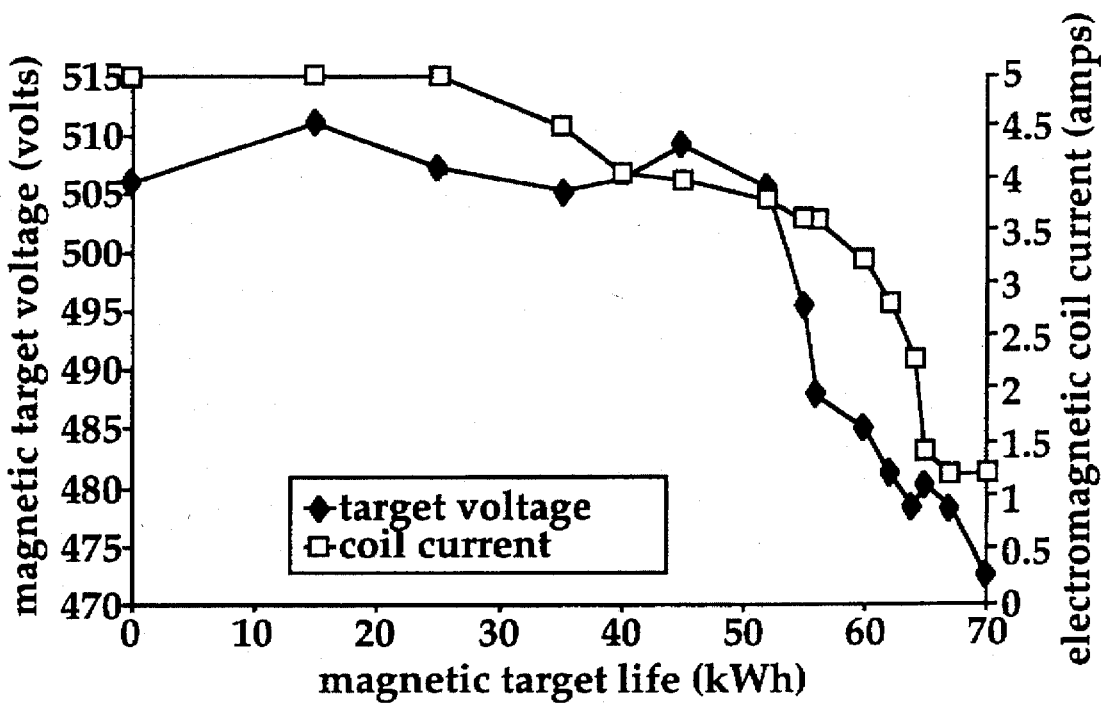
FIG. 9 is a plot of magnetic target voltage ($\blacklozenge$) and electromagnetic coil current ($\Box$) in Amps, as a function of magnetic target life, in kWh.

The assembly of the present invention extends target lifetime, as shown in FIG. 9. Seen here is a plot of target voltage (♦) and electromagnetic coil current (□) in Amps, as a function of magnetic target life, in kWh, for a 0.25 inch CoCrTa (88/8/4) magnetic target. There is little change in the target voltage required to sustain the sputtering plasma for about 50 KW hours.

Figure 10:
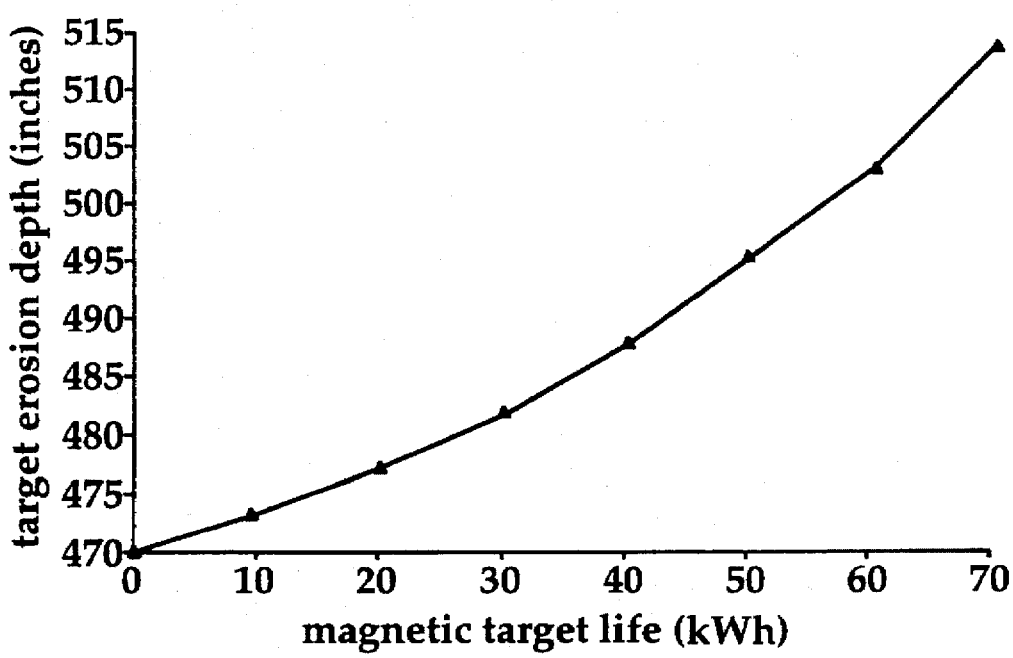
FIG. 10 is a plot of target erosion depth in inches as a function of target life in kWh for a CoCrTa magnetic target.

FIG. 10 is a plot of target erosion depth in inches as a function of target life in kWh for a CoCrTa magnetic target. Erosion depth was measured using a depth micrometer and taken at the deepest point on the erosion groove. The target, having an initial thickness of 0.25 inches, was 50% utilized after about 47 kW hours of sputtering, and exhausted after 70 kW hours.

Figure 11:
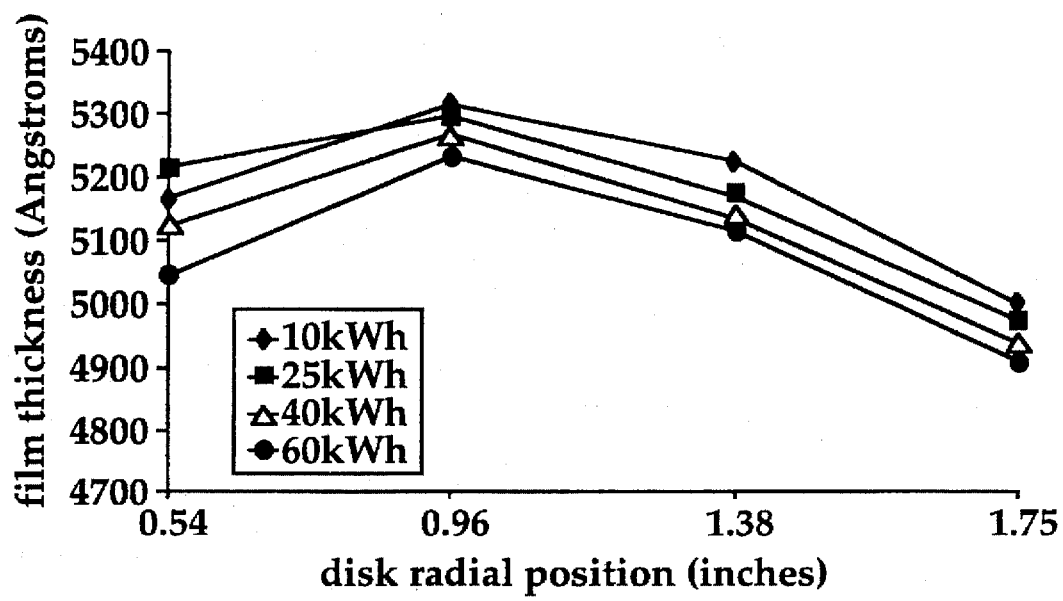
FIG. 11 shows film thickness in Å as a function of radial position on a 95 mm substrate after sputtering from a CoCrTa target for 10 kWh ($\blacklozenge$), 25 kWh ($\blacksquare$), 40 kWh ($\Delta$) and 60 kWh (o)

The broader area of target sputtering contributes to more uniform film-thickness deposition of a substrate surface, as shown in FIG. 11. Film thickness was measured as a function of radial position on a 95 mm substrate after sputtering from a CoCrTa target for 10 kWh (♦), 25 kWh (■), 40 kWh (Δ) and 60 kWh (o). As seen, film thickness varied by only about 3% across the diameter of the disc after sputtering for a given period of time. Also, film thickness was uniform across the diameter of the disc from the beginning to the end of target lifetime.

III. Method of Forming a Magnetic Recording Medium

In another aspect, the invention includes a method of forming on a substrate a thin-film layer in a magnetic recording medium. In particular, the invention includes a method of forming on a substrate a magnetic recording layer in a magnetic recording medium, and more particularly, a cobalt-based magnetic recording layer.

Figure 12:
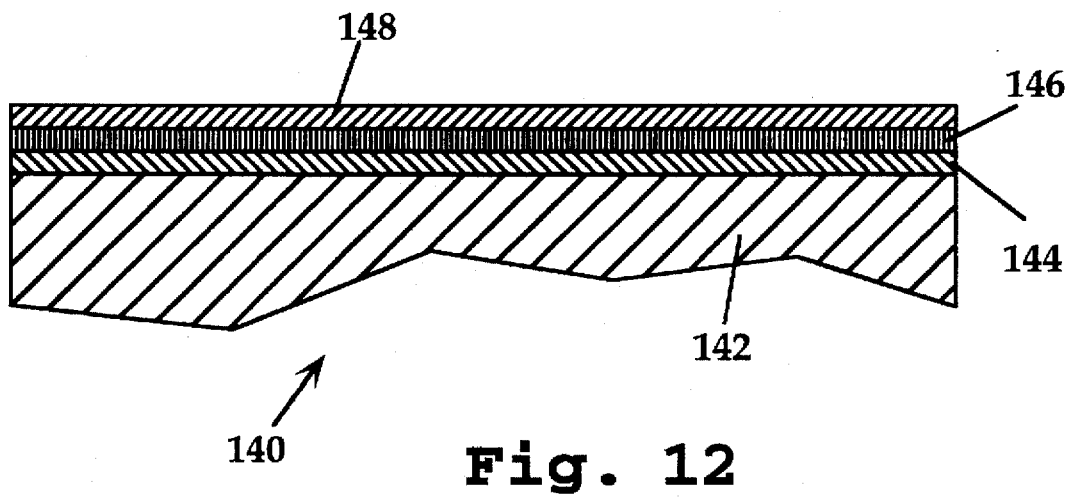
FIG. 12 shows in cross sectional view, a fragmentary portion of a thin-film medium fabricated in accordance with the method of the present invention.
Figure 13:
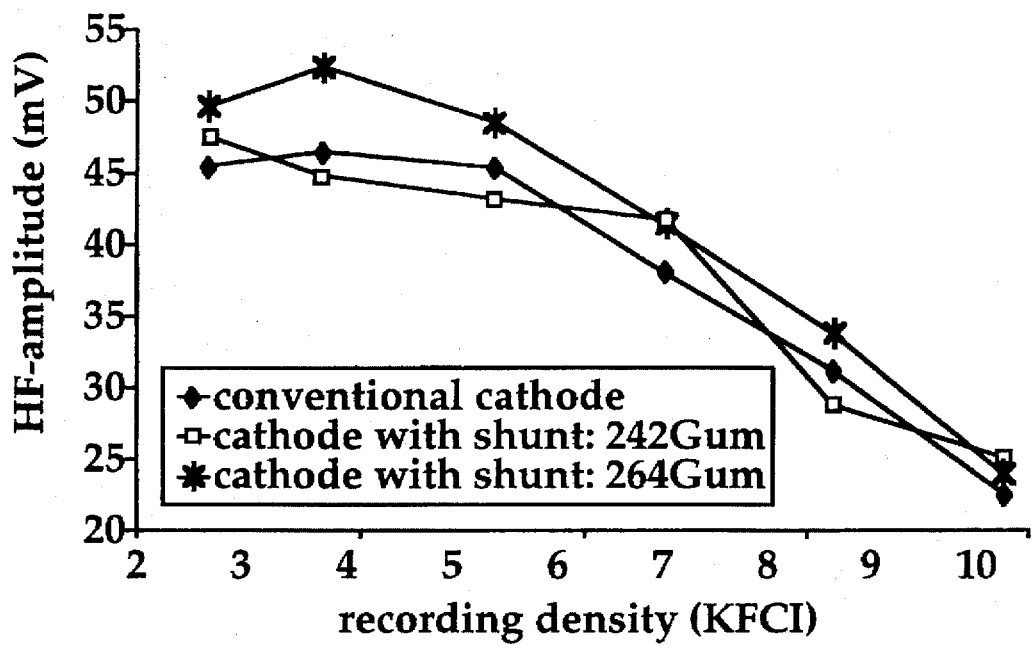
FIG. 13 is a plot of high frequency signal amplitude, in mV, as a function of recording density, in kiloflux changes per inch (KFCI), for media prepared with the cathode assembly of the present invention and having a magnetic remanence thickness of 242 Gauss-microns (Gµm) ($\Box$) and 264 Gµm (*) and for a comparative medium prepared using a standard cathode assembly ($\blacklozenge$)
Figure 14:
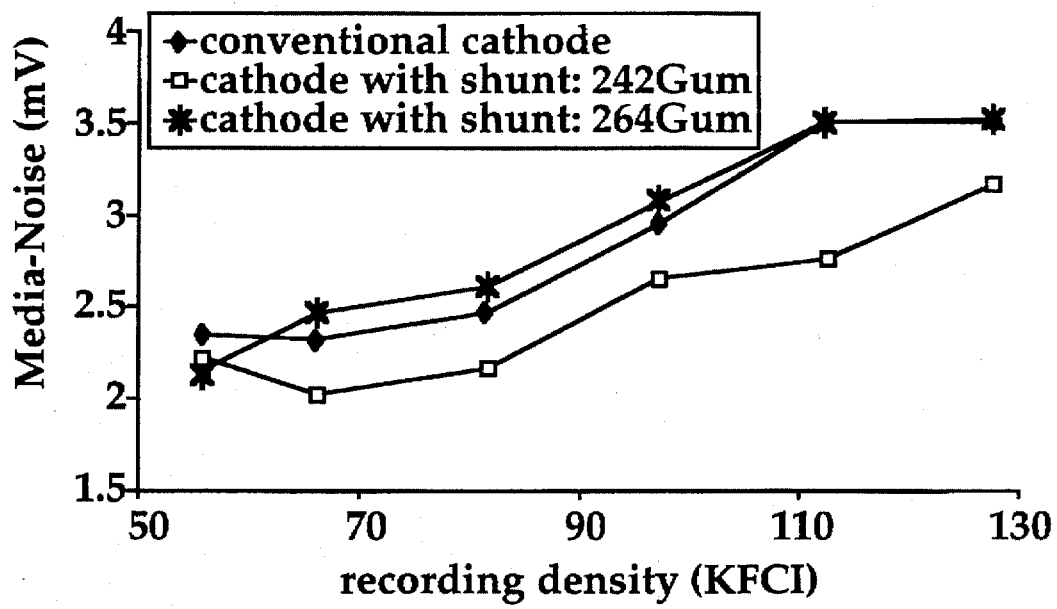
FIG. 14 is a plot of media noise, in mV, as a function of recording density, in KFCI, for media prepared with the cathode assembly of the present invention and having a magnetic remanence thickness of 242 Gµm ($\Box$) and 264 Gµm (*) and for a comparative medium prepared using a standard cathode assembly ($\blacklozenge$)
Figure 15:
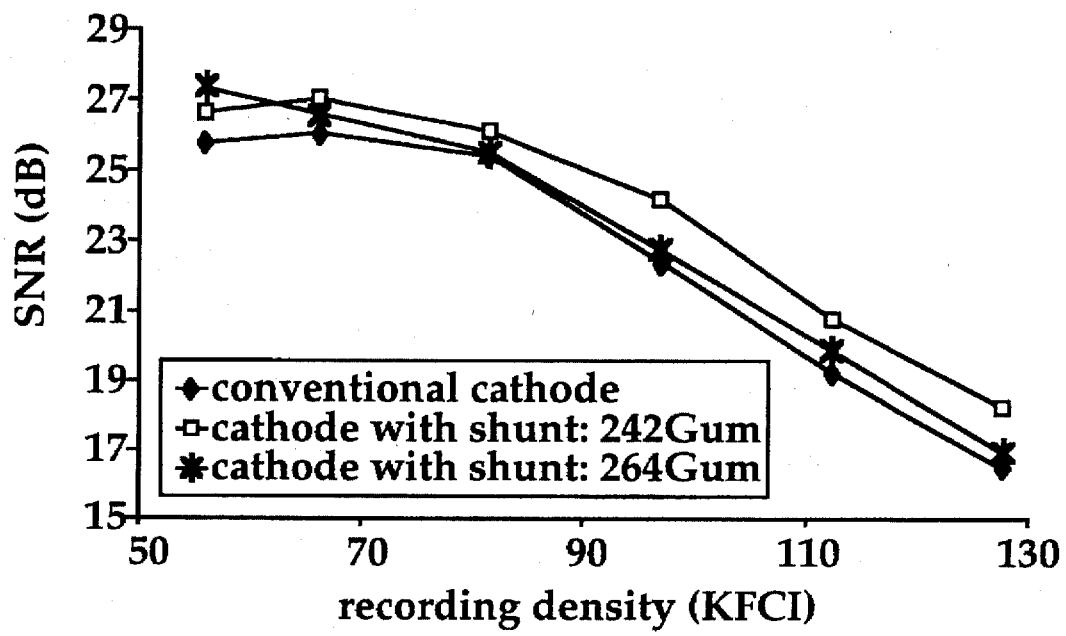
FIG. 15 is a plot of signal-to-noise ratio, in dB, as a function of recording density, in KFCI, for media prepared with the cathode assembly of the present invention and having a magnetic remanence thickness of 242 Gµm ($\Box$) and 264 Gµm (*) and for a comparative medium prepared using a standard cathode assembly ($\blacklozenge$)
Figure 16:
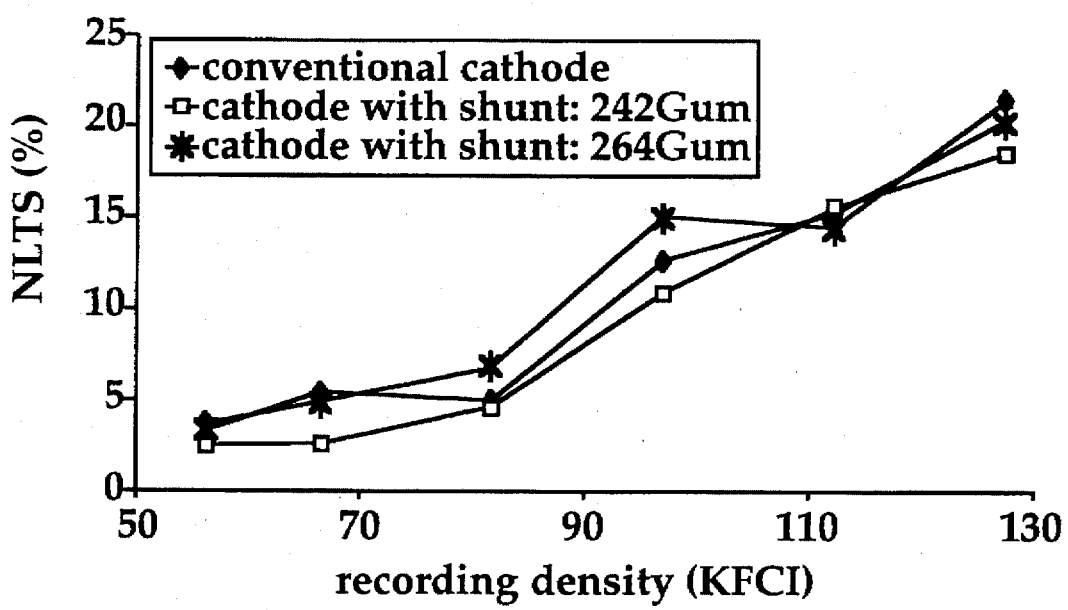
FIG. 16 is a plot of non-linear transition shift (NLTS), in %, as a function of recording density, in KFCI, for media prepared with the cathode assembly of the present invention and having a magnetic remanence thickness of 242 Gµm ($\Box$) and 264 Gµm (*) and for a comparative medium prepared using a standard cathode assembly ($\blacklozenge$).

FIG. 12 shows in cross sectional view, a fragmentary portion of a thin-film medium 140 composed of a rigid disk-like substrate 142, and forming successive thin-film layers over the substrate, an underlayer 144, a magnetic thin-film layer 146, and an overcoat 148.

Substrate 142 may be metallic or non-metallic. Underlayer 144 is preferably crystalline and formed of chromium or of a chromium-based alloy containing at least 50% chromium, such Cr-Si, Cr-V, Cr-Gd, or Cr-Ti. The underlayer is sputtered to a thickness between about 100–3,000 Å.

Magnetic film layer 146 is preferably composed of a cobalt-based alloy and is deposited to a thickness of between 100–800 Å. By cobalt-based alloy is meant an alloy containing at least 50% cobalt. Exemplary binary alloys include Co/Cr or Co/Ni, and exemplary ternary, quaternary, and five-element alloys include Co/Cr/Ta, Co/Ni/Pt, Co/Ni/Cr, Co/Cr/Ta/Pt, Co/Ni/Cr/Pt, and Co/Cr/Ni/Pt/B. A preferred cobalt-based alloy is composed of 80–90% cobalt, 5–20% chromium and 2–10% tantalum. Most preferred alloys include 84.5% cobalt, 12.5% chromium, 3.0% tantalum and 88% cobalt, 8% chromium and 4% tantalum.

Overcoat 148 may be composed of carbon, silicon oxide, silicon nitride, or other suitable material giving wear-resistant, protective properties to the medium.

Medium 140 is formed, in accordance with the method of the invention, by placing the substrate in a sputtering apparatus having a series of sputtering chambers, where at least one of the sputtering chambers has a cathode assembly like that described in FIG. 1. Sputtering apparatus are commercially available from various sources, such as Circuits Processing Apparatus (Fremont, Calif.), Leybald Heraeus (Germany), VACTEK (Boulder, Colo.), Materials Research Corp (Albany, N.Y.), Varian/Intevac (Santa Clara, Calif.) or Anelva (Japan). These systems are all double-sided, in-line, high-throughput machines having two interlocking chambers for loading and unloading. The sputtering chambers of these systems can be modified to accommodate the cathode assembly of the present invention.

In operation, the substrate is initially passed through a heating station having a plurality of infrared lights which are arrayed for heating both sides of a substrate.

Downstream of the heating station is a first sputtering station where a chromium under layer is deposited on the NiP-plated substrate. The coated substrate is shuttled downstream to a sputtering chamber housing the cathode assembly of the present invention for deposition of the magnetic recording layer. The sputtering plasma is ignited by energizing the target and the shunt is moved repeatedly between first and second positions, as described above. The magnetic layer is deposited on the substrate to the desired thickness.

Deposition of a wear-resistant overcoat is performed by shuttling the coated substrate to a sputtering chamber further downstream which houses a pair of targets composed of carbon, silicon nitride, or other suitable protective material.

Experiments were done in support of the invention by fabricating magnetic recording media by depositing on a nickel-plated aluminum substrate a chromium underlayer, a CoCrTa (88/8/4) recording layer and a carbon overcoat. The CoCrTa magnetic layer was deposited using the cathode assembly described herein. The media were characterized by static and dynamic magnetic recording tests, described below.

Table 1 shows the static magnetic properties of two magnetic recording media, each having a chromium underlayer of 500 Å, and where a bias of –350 volts was applied to the substrate during deposition of the CoCrTa magnetic layer. The media have a coercivity of 2056 and 2073, comparable to the comparative media prepared with the same specifications but with a standard cathode assembly, e.g., an assembly lacking the rotating magnetic-field shunt.

TABLE 1

| Medium | Coercivity (Oe) | SR | S* | OR | Mrt (Gμm) |
|---|---|---|---|---|---|
| Medium #1 | 2056 | 0.92 | 0.96 | 1.40 | 24 2 |
| Medium #2 | 2073 | 0.92 | 0.92 | 1.38 | 264 |
| Comparative Medium | 2061 | 0.92 | 0.86 | 1.34 | 242 |

Table 2 shows parametrics for three media prepared as described above, summarizing coercivity, magnetic remanence thickness (Mrt), high frequency signal amplitude (HF), resolution (Res.), overwrite (OW), pulse-width (PW50) and bit shift (BS) measured at the disc's inner and outer diameters.

TABLE 2

| Medium | Coercivity (Oe) | Mrt (Gμm) | HF (uV) | Res. (%) | OW (–dB) | PW50 (ns) | BS (ns) |
|---|---|---|---|---|---|---|---|
| ID: R = 0.834" (HF: 13.45 MHz) | | | | | | | |
| #1 | 2056 | 242 | 329 | 100.2 | 35.8 | 26.8 | 5.32 |
| #2 | 2073 | 264 | 346 | 99.4 | 34.8 | 27.7 | 5.24 |
| #3 | 2150 | 234 | 326 | 99.6 | 35.6 | 26.9 | 5.35 |
| OD: R = 1.409" (HF: 24.34 MHz) | | | | | | | |
| #1 | 2059 | 242 | 530 | 98.0 | 36.4 | 16.8 | 3.01 |
| #2 | 2073 | 264 | 560 | 98.0 | 35.0 | 17.4 | 2.97 |
| #3 | 2150 | 234 | 525 | 97.2 | 36.2 | 16.9 | 2.98 |

FIGS. 13–16 show HF signal amplitude (FIG. 13), total media noise (FIG. 14) and signal-to-noise ratio (FIG. 14) and non-linear transition shift (NLTS) (FIG. 16) as a function of linear recording density for media prepared with the cathode assembly of the present invention and having a magnetic remanence thickness of 242 G$\mu$m (□) and 264 G$\mu$m (*). A comparative medium was prepared using a standard cathode assembly (♦) to have a magnetic remanence thickness of 234 Gauss-microns and tested.

As seen in the figures, magnetic recording media prepared using the cathode assembly of the present invention have magnetic recording properties equal or better than media prepared using a conventional cathode assembly.

From the foregoing, it will be appreciated how various objects and features of the invention are met. The cathode assembly includes a magnetic-field shunt that moves between first and second positions, thereby shifting the magnetic field between two positions, for preferential sputtering from the target in first and second target regions. Sputter deposition using the assembly results in target erosion over more of the target area, increasing target lifetime. Another benefit of better target utilization is increased uniformity of sputtered films, over the lifetime of the target.

It will be appreciated that various structural modifications may be made to achieve different selected erosion patterns and characteristics by varying the size, shape, magnetic characteristics (e.g., orientation of magnetic poles, source and strength of magnetic field) and position of the magnetic-field shunt of the cathode assembly.

It will therefore be apparent to one skilled in the art that variations in form and detail may be made in the preferred embodiment without varying from the spirit and scope of the invention as defined in the claims. The preferred embodiment is thus provided for purposes of explanation and illustration, but not limitation.

It is claimed:

1. A cathode assembly for use in a magnetron sputtering apparatus, comprising:

a sputtering target having a planar sputtering surface;

north and south magnetic poles disposed with respect to the target to produce a magnetic field over the target surface for magnetron sputtering;

a magnetic-field shunt disposed between the target and said magnetic poles; and means for moving the shunt relative to the poles between first and second positions at which the magnetic field on the target surface causes preferential target erosion at first and second target regions, respectively, whereby repeated movement of the shunt between such first and second positions during target sputtering is effective to produce preferential erosion over said first and second regions, respectively.

2. The assembly of claim 1, wherein said shunt includes a center region disposed over one of said north or south magnetic poles;

a first shunt portion extending radially out from said center region to function as a radial extension of said one pole;

a second shunt portion attached to, but spaced from, said center region to function as an extension of the other pole; and means for moving the shunt includes means for rotating said shunt about an axis substantially normal to the plane of the target surface.

3. The assembly of claim 1, wherein said target is composed of a magnetic material.

4. The assembly of claim 3, wherein said target is composed of a cobalt-based magnetic alloy.

5. The assembly of claim 1, wherein said north and south magnetic poles are produced by an electromagnetic coil.

6. The assembly of claim 1, wherein said north and south magnetic poles are produced by a permanent magnet.

7. A cathode assembly for use in a magnetron sputtering apparatus, comprising:

a sputtering target having a planar sputtering surface;

north and south magnetic poles disposed with respect to the target to produce a magnetic field over the target surface for magnetron sputtering;

a magnetic-field shunt disposed between the target and said magnetic poles; and means for moving the shunt relative to the poles between first and second positions at which the shunt functions as an extension of the north and south poles;

whereby repeated movement of the shunt between such first and second positions shifts the magnetic-field between first and second target regions, respectively, to produce preferential target erosion in said first and second target regions.

8. The assembly of claim 7, wherein shunt includes a center region disposed over one of said north or south magnetic poles;

a first shunt portion extending radially out from said center region to function as a radial extension of said one pole;

a second shunt portion attached to, but spaced from, said center portion to function as an extension of the other pole; and means for moving the shunt includes means for rotating said shunt about an axis substantially normal to the plane of the target surface.

9. The assembly of claim 7, wherein said target is composed of a magnetic material.

10. The assembly of claim 9, wherein said target is composed of a cobalt-based magnetic alloy.

11. The assembly of claim 7, wherein said north and south magnetic poles are produced by an electromagnetic coil.

12. The assembly of claim 7, wherein said north and south magnetic poles are produced by a permanent magnet.

13. A method of forming on a substrate by sputter deposition a thin-film layer in a magnetic recording medium, comprising placing a substrate in a sputtering chamber including a cathode assembly composed of (i) a sputtering target having a planar sputtering surface, (ii) north and south magnetic poles disposed with respect to the target to produce a magnetic field over the target surface for magnetron sputtering, (iii) a magnetic-field shunt disposed between the target and said magnetic poles, and (iv) means for moving the shunt relative to the poles between first and second positions at which the magnetic field on the target surface causes preferential target erosion at first and second target regions, respectively, whereby repeated movement of the shunt between such first and second positions during target sputtering is effective to produce preferential erosion over said first and second regions, respectively;

igniting a sputtering plasma by energizing said target;

moving said shunt repeatedly between said first and second positions; and sputtering said layer onto said substrate.

14. The method of claim 13, wherein said shunt includes a center region disposed over one of said north or south magnetic poles;

a first shunt portion extending radially out from said center region to function as a radial extension of said one pole;

a second shunt portion attached to, but spaced from, said center portion to function as an extension of the other pole; and means for moving the shunt includes means for rotating said shunt about an axis substantially normal to the plane of the target surface.

15. The method of claim 13, wherein said sputtering is from a target is composed of a magnetic material.

16. The method of claim 15, wherein said target is composed of a cobalt-based magnetic alloy.

17. The method of claim 13, wherein said north and south magnetic poles are produced by an electromagnetic coil.

18. The assembly of claim 13, wherein said north and south magnetic poles are produced by a permanent magnet.

* * * * *